US009465063B2

(12) United States Patent
De Marco et al.

(10) Patent No.: US 9,465,063 B2
(45) Date of Patent: Oct. 11, 2016

(54) METHOD AND SYSTEM FOR THE ESTIMATION AND CANCELLATION OF MULTIPATH DELAY OF ELECTROMAGNETIC SIGNALS, IN PARTICULAR SSR REPLIES

(71) Applicant: SELEX ES S.P.A., Rome (IT)

(72) Inventors: Patrizio De Marco, Rome (IT); Antonio Di Marzo, Rome (IT)

(73) Assignee: SELES ES S.P.A., Rome (IT)

( * ) Notice: Subject to any disclaimer, the term of this patent is extended or adjusted under 35 U.S.C. 154(b) by 841 days.

(21) Appl. No.: 13/869,839

(22) Filed: Apr. 24, 2013

(65) Prior Publication Data

US 2013/0282319 A1  Oct. 24, 2013

(30) Foreign Application Priority Data

Apr. 24, 2012  (IT) ............................. RM2012A0175

(51) Int. Cl.
  *H04B 1/10* (2006.01)
  *G01R 29/027* (2006.01)
  *G01S 13/78* (2006.01)

(52) U.S. Cl.
  CPC ......... *G01R 29/0273* (2013.01); *G01S 13/781* (2013.01); *H04B 1/10* (2013.01)

(58) Field of Classification Search
  CPC combination set(s) only.
  See application file for complete search history.

(56) References Cited

U.S. PATENT DOCUMENTS

| 5,414,729 A | 5/1995 | Fenton |
| 7,085,309 B2 * | 8/2006 | Oesch et al. .................. 375/142 |
| 2002/0186794 A1 | 12/2002 | Oesch et al. |

FOREIGN PATENT DOCUMENTS

EP  2658132 B2  10/2013

OTHER PUBLICATIONS

Substantive Examination Adverse Report for Malaysian Patent Application No. PI 2013001437 filed on Apr. 23, 2013 in the name of SELEX ES S.P.A. Mail date: Apr. 30, 2015.
Search Report for Malaysian Patent Application No. PI 2013001437 filed on Apr. 23, 2013 in the name of SELEX ES S.P.A. Mail date: Apr. 30, 2015.
Search Report for Italian Patent Application No. RM20120175 filed on Apr. 24, 2012 in the name of SELEX Sistemi Integrati S.P.A. Completion date: Jan. 8, 2013.
Written Opinion for Italian Patent Application No. RM20120175 filed on Apr. 24, 2012 in the name of SELEX Sistemi Integrati S.P.A. Completion date: Jan. 8, 2013.

(Continued)

*Primary Examiner* — Huan Tran
(74) *Attorney, Agent, or Firm* — Steinfl & Bruno, LLP

(57) ABSTRACT

A method and system for the estimation and correction of the multipath delay is described. The method comprising analyzing the distortion of the autocorrelation function of each single impulse received with that of an ideal impulse, deriving back the variation of the impulse parameters and estimating the effect of the multipart to be taken into account for compensation on the estimation of the time of arrival (TOA) of the electromagnetic signal.

20 Claims, 9 Drawing Sheets

(56) References Cited

OTHER PUBLICATIONS

European Search Report for European Patent Application No. EP13425059 filed in the name of SELEX ES S.P.A. Completion date: Jul. 1, 2013.
Irsigler, M. et al. "Multipath Performance Analysis for Future GNSS Signals." Proceedings of the National Technical Meeting of the Satellite Division of the Institute of Navigation, ION NTM 2004, Jan. 26-28, 2004.
Townsend, B. et al. "A Practical Approach to the Reduction of Pseudorange Multipath Errors in a L1 GPS Receiver." Proceedings of the Institute of Navigation (ION) GPS, vol. 1, pp. 143-148. Jan. 1994.

* cited by examiner

Step 1 - Sample an electromagnetic signal received by an antenna

Step 2 - Calculate an autocorrelation function of the sampled electromagnetic signal Step 3 - Calculate a first set of abscissa distance values ($T_m$) for an impulse of the electromagnetic signal Step 4 - Calculate a second set of abscissa distance values ($T^S_{1,1} \ldots T^S_{M,L}$) from an ideal electromagnetic signal Step 5 - Individuate, among all the second set of abscissa distance values, particular second set of abscissa distance values that are closer to values of the first set of distance values thereby indicating relevance Step 6 - Associate the first set of abscissa values with the estimation errors that are relevant to the corresponding second set of abscissa values Step 7 - Utilize a statistical analysis of a distribution of the estimation errors to reduce a standard deviation and select a subset of estimation values most close to each other Step 8 - Perform an average of the subset of estimation values thereby obtaining an average value assumed to be the estimation error for the electromagnetic signal received by the antenna

Fig. 14

METHOD AND SYSTEM FOR THE ESTIMATION AND CANCELLATION OF MULTIPATH DELAY OF ELECTROMAGNETIC SIGNALS, IN PARTICULAR SSR REPLIES

CROSS REFERENCE TO RELATED APPLICATIONS

The present application claims priority to Italian Patent Application no. RM2012A000175 filed on Apr. 24, 2012 and incorporated herein by reference in its entirety.

FIELD

Embodiments of the present disclosure pertain to computer systems and methods for the estimation and cancellation of multipath delay of electromagnetic signals, for example, SSR replies.

SUMMARY

According to a first aspect of the present disclosure, a computer system for estimating time of arrival of electromagnetic signals affected by multipath is provided, the computer configured to perform the following steps: a) sampling, by the computer, an electromagnetic signal received by an antenna, wherein the sampling is performed, by the computer, using a sampling step (p>0) and produces 2k+1 samples where k is a positive integer; b) calculating, by the computer, an autocorrelation function of a sampled electromagnetic signal; c) calculating, by the computer, a first set of abscissa distance values ($T_m$) for an impulse of the electromagnetic signal of M values, between an intersection point and a maximum point of the autocorrelation function; d) calculating, by the computer, second set of abscissa distance values ($T^S_{1,1} \ldots T^S_{M,L}$) from an ideal electromagnetic signal; e) individuating, by the computer, among all the second set of abscissa distance values, particular second set of abscissa distance values that are closer to values of the first set of abscissa distance values obtained in step c) thereby indicating relevance; f) associating, by the computer, the first set of abscissa distance values with estimation errors relevant to the second set of abscissa distance values; g) utilizing, by the computer, a statistical analysis of a distribution of the estimation errors obtained in step f) to reduce standard deviation of the distribution and select a subset of estimation values most close to each other; and h) performing, by the computer, an average of the subset of estimation values thereby obtaining an average value, the average value being assumed as the estimation error of said electromagnetic signal received by the antenna.

According to a second aspect of the present disclosure, a computer-based method for estimating time of arrival of electromagnetic signals affected by multipath is described, the method comprising: a) sampling, by a computer, an electromagnetic signal received by an antenna, wherein the sampling is performed using a sampling step (p>0) and produces 2k+1 samples where k is a positive integer; b) calculating, by the computer, an autocorrelation function of a sampled electromagnetic signal; c) calculating, by the computer, a first set of abscissa distance values ($T_m$) for an impulse of the electromagnetic signal of M values, between an intersection point and a maximum point of the autocorrelation function; d) calculating, by the computer, second set of abscissa distance values ($T^S_{1,1} \ldots T^S_{M,L}$) from an ideal electromagnetic signal; e) individuating, by the computer, among all the second set of abscissa distance values, particular second set of abscissa distance values that are closer to values of the first set of abscissa distance values obtained in step c) thereby indicating relevance; f) associating, by the computer, the first set of abscissa distance values with estimation errors relevant to the second set of abscissa distance values; g) utilizing, by the computer, a statistical analysis of a distribution of the estimation errors obtained in step f) to reduce standard deviation of the distribution and select a subset of estimation values most close to each other; and h) performing, by the computer, an average of the subset of estimation values thereby obtaining an average value, the average value being assumed as the estimation error of said electromagnetic signal received by the antenna.

According to a third aspect of the present disclosure, a method for the estimation of the time of arrival of electromagnetic signals affected by multipath, e.g. SSR replies, comprising the execution of the following steps: A1) sampling an electromagnetic signal received by an antenna, with a sampling step p>0, the sampling step producing 2k+1 samples with k positive integer; and A2) Calculation of an autocorrelation function of the sampled electromagnetic signal obtained in step A1; wherein the following further steps are performed: B) for an impulse of said electromagnetic signal, and for each value of m=1, . . . M, wherein m e M are positive integers, performing the following sub-steps: B1) choosing a set of N points on the right-hand side of a maximum of said autocorrelation function, and N points on the left-hand side of said maximum, with N positive integer smaller than k; B2) calculating a first polynomial interpolating the points of said set of N points on the right-hand side and a second polynomial interpolating the points of said set of N points on the left-hand side; and B3) calculating an intersection point of said first and said second interpolating polynomial, and an abscissa distance $T_m$ between said intersection point and the maximum of said autocorrelation function, $T_m$ representing an estimation value of the multipath effect; C) starting from an ideal electromagnetic signal with equal impulses having periodicity $T^I$: C) delaying each impulse of said ideal electromagnetic signal by a predefined different time till one finds a same periodicity $T^I$, obtaining a delayed signal; C2) multiplying L times, with L a positive integer, the delayed signal of the C1 step by a coefficient h each time different, h being a real number comprised between −1 and 1, and summing up the result of the multiplication to said ideal electromagnetic signal, obtaining L composed electromagnetic signals simulating different effects of multipath and for which one knows by construction the ideal time of arrival in the absence of multipath; C3) estimating a time of arrival of each of said L composed electromagnetic signals, obtaining an estimation of the time of arrival having by construction an estimation error due to the effect of the multipath, that is calculated as a difference between the ideal time of arrival and the estimated time of arrival; C4) executing the steps A1, A2, B1, B2, B3 on said composed electromagnetic signal, obtaining L×M simulated values for the abscissa distance $T^S_{1,1} \ldots T^S_{M,L}$ between said intersection point and the maximum of said autocorrelation function for the L composed electromagnetic impulses; and C5) associating to each of said L×M distance simulated values $T^S_{1,1} \ldots T^S_{M,L}$ the corresponding estimation error $e^S_{1,1} \ldots e^S_{M,L}$; D) Individuating among the values $T^S_{1,1} \ldots T^S_{M,L}$ the simulated values $T^S_1 \ldots T^S_M$ closer to values $T_1 \ldots T_M$ of step B; E) associating to said values $T_1 \ldots T_M$ the estimation errors relevant to the values $T^S_1 \ldots T^S_M$; F) utilizing a statistical analysis of the distribution of the estimation errors obtained in step E, to reduce the standard deviation of said distribution and select a subset $e_1 \ldots e_v$ of the estimation values most close to each other; and G) performing an average of said $e_1 \ldots e_v$, obtaining an average value, the average value being assumed as the estimation error of said electromagnetic signal received by an antenna.

The statistical analysis referred to here is made according to the known art. There are many ways in the literature to reduce the standard deviation.

According to an aspect of the disclosure, the step of associating to each of said L×M distance simulated values $T^S_{1,1} \ldots T^S_{M,L}$ to corresponding estimation error $e^S_{1,1} \ldots e^S_{M,L}$ is performed as construction of a lookup table. Furthermore, the associating of the L×M distance simulated values $T^S_{1,1} \ldots T^S_{M,L}$ to the relevant estimation errors and utilizing the statistical analysis of the distribution of the estimation errors are performed by using said lookup table.

The use of the lookup table implements a mechanism of best fit by comparing the found coefficients with the values of the multipaths relevant to the simulated curves. The comparison can be also realized by seeking the minimum of a functional which includes all the found and simulated coefficients.

The real number h represents how the reflected signal copes with the signal of the LOS, and takes into account the phase as well. One can observe that can a minimum increment of the delay cannot be lower than the sampling step.

According to an aspect of the disclosure, choosing the set of N points, calculating the first polynomial and calculating the intersection point the sub-steps B1-B3 of the B step are executed by:

B1. Choosing two points pairs symmetrically on one side and the other of the ordinates axis passing for the maximum point of the autocorrelation function, having coordinates $X_{1,m}, Y_{1,m}, X_{2,m}, Y_{2,m}$ for the first pair on the left-hand side of said axis and $X_{3,m}, Y_{3,m}, X_{4,m}, Y_{4,m}$ for the second pair on the right-hand side of said axis;

B2. Calculating the two angular coefficients $a^L_m$, $a^R_m$ of the two straight lines passing respectively for the points of said first and said second points pair;

B3. Calculating an estimation value $T_m$ of the multipath effect according to the relationship:

$$T_m = (Y_{1,m} - Y_{4,m}) + d/2((a^L_m + a^R_m)/(a^L_m - a^R_m))$$

Wherein d is the distance of the two points of the two pairs immediately close to the axis passing for the maximum of said autocorrelation function.

According to an embodiment of the present disclosure, the number of values of said lookup table depends on the time sampling step p of the sampling of the step A1.

According to an embodiment of the present disclosure, said electromagnetic signal is constituted by a SSR reply, and the steps from A to G are applied to each single impulse of said SSR reply, thus obtaining a corresponding plurality of multipath delay values, said plurality of values undergoing a further statistical analysis to determine the best estimation value of the multipath delay for the whole SSR reply.

For example, the statistical analysis can determine and eliminate possible values corresponding to distortions of the signal, which do not depend on the multipath effect, and calculate the average of the good values as final value of the multipath.

An embodiment of the present disclosure comprises code means set up to carry out, when operating on a computer, the methods of the present disclosure.

In another embodiment of the present disclosure, the methods can be stored in a tangible memory support readable by a computer.

Lastly, an embodiment of the present disclosure shows that an electronic elaborator can have the methods of the present disclosure installed on it.

BRIEF DESCRIPTION OF THE DRAWINGS

FIG. 14 shows a flowchart of the steps performed by the computer-based system for the method of estimation and cancellation method according to an embodiment of the present disclosure.

DETAILED DESCRIPTION

Embodiments of the present disclosure provide a method and system for the estimation (and the subsequent cancellation) of the multipath delay which solves the problems and overcomes the inconveniences of the prior art.

More in detail, embodiments of the present disclosure describe a method for the estimation and correction of the multipath delay by the analysis of the distortion of the autocorrelation function of each single impulse received with that of an ideal impulse. On the basis of the obtained distortion with respect to the ideal correlation function, the variation of the impulse parameters can be derived and estimates for the effect of the multipath can be taken into account for compensation on the estimation of the time of arrival (TOA) of the electromagnetic signal.

Figure 1:
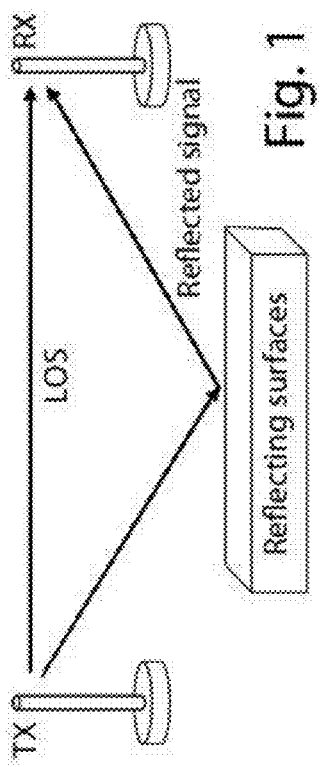
FIG. 1 shows a scheme of a situation wherein a multipath effect is created, according to the prior art.

With the term "multipath", it is meant to describe the phenomenon of superposition of an electromagnetic wave, which is being received, with the reflections of the same being generated by the surrounding environment, which undergo different attenuations (see, for example, FIG. 1). As a consequence of the multipath, the receiver (RX) is reached with both the direct signal transmitted by the source (TX) along the line of sight (LOS) and also by the signal that has traveled different paths and has reached the receiver RX after subsequent reflections on the surrounding objects. The latter signal consequently has a time delay with respect to the direct signal. The problem of the multipath is present in many radio frequency (RF) systems, for example GPS receivers, GSM receivers, etc.

It is desired that the estimation and cancellation of the multipath delay on the SSR replies be provided for air surveillance systems. A utilized air localization system is the multilateration, both local in the airport (on-ground) and in the approaching zones (on-air), both wide area on-air TMA (Traffic Management Advisor) and "En-Route". Furthermore, the technique can be used in other non-aeronautical domains.

The multilateration is a target localization system based on the measurement of the time of arrival (TOA) of the SSR replies transmitted by the same target. It is understood that the term "target" means any aircraft provided with an avionic transponder suitable to transmit mode A/C/S secondary surveillance radar (SSR) replies. The multilateration system allows estimation of the position of the transponder by using the time of arrival measurements of the signal transmitted by the target and received by the different sensors distributed in different positions. The different sensors distributed in different positions are accurately known beforehand.

The application scenario of a multilateration system is therefore a complex scenario wherein the infrastructures that are present in the airport play a fundamental role in the generation of the multipath. For example, the terminals, the parking areas, the parked aircrafts and so on are able to generate reflections and give rise to multipath phenomena. The effect of the multipath on the system is twofold: on one hand, it creates a condition of offset on the real position of the target. On the other hand it also introduces a noise on the estimation of the position.

Figure 2:
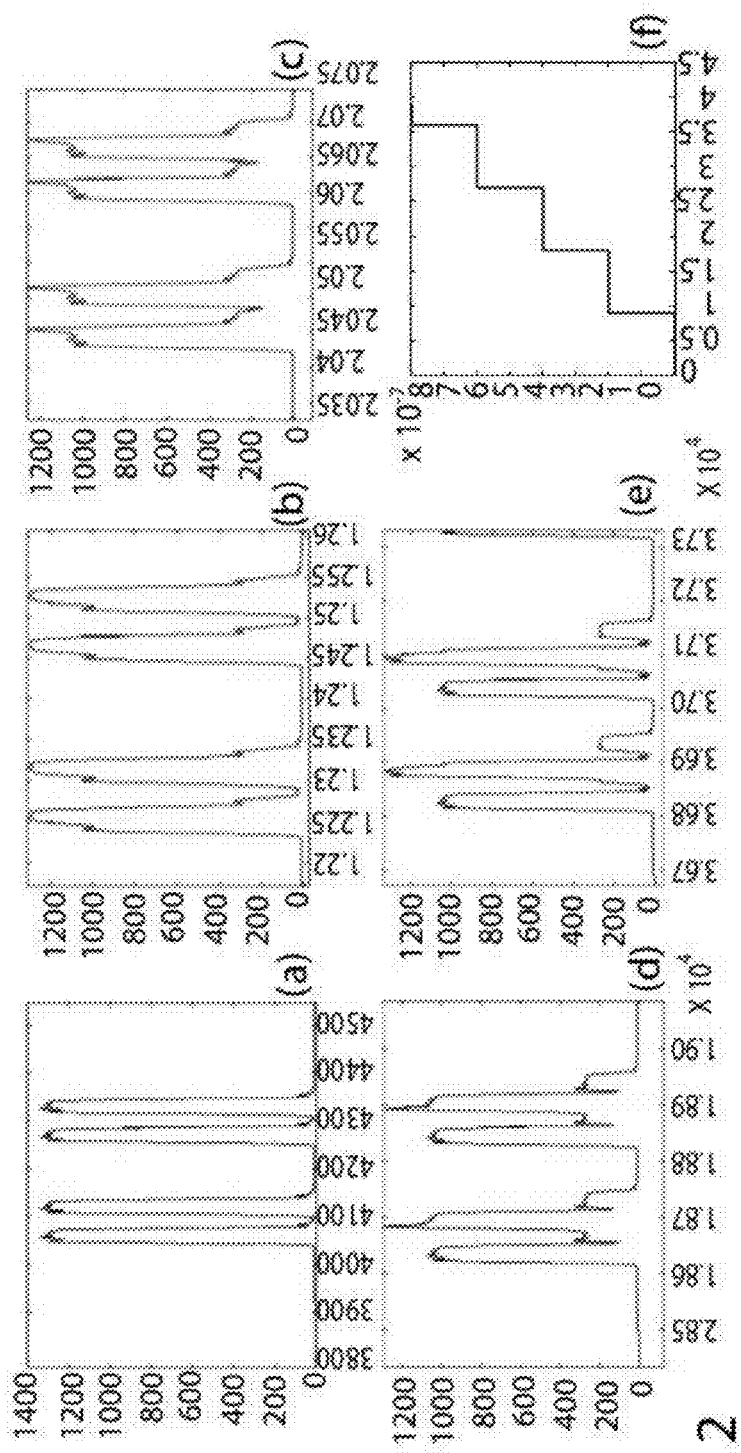
FIGS. 2 (a)-(f) show examples of the multipath effect on the preamble of the mode S replies wherein the level of the reflected signal is reduced of around ¾ with respect to the signal coming from the line of sight of the receiver, both in phase and with variable delay times (with steps of 200 ns, five steps) with respect to the direct LOS ray, with in-phase multipath signal according to the prior art.
Figures 3, 4:
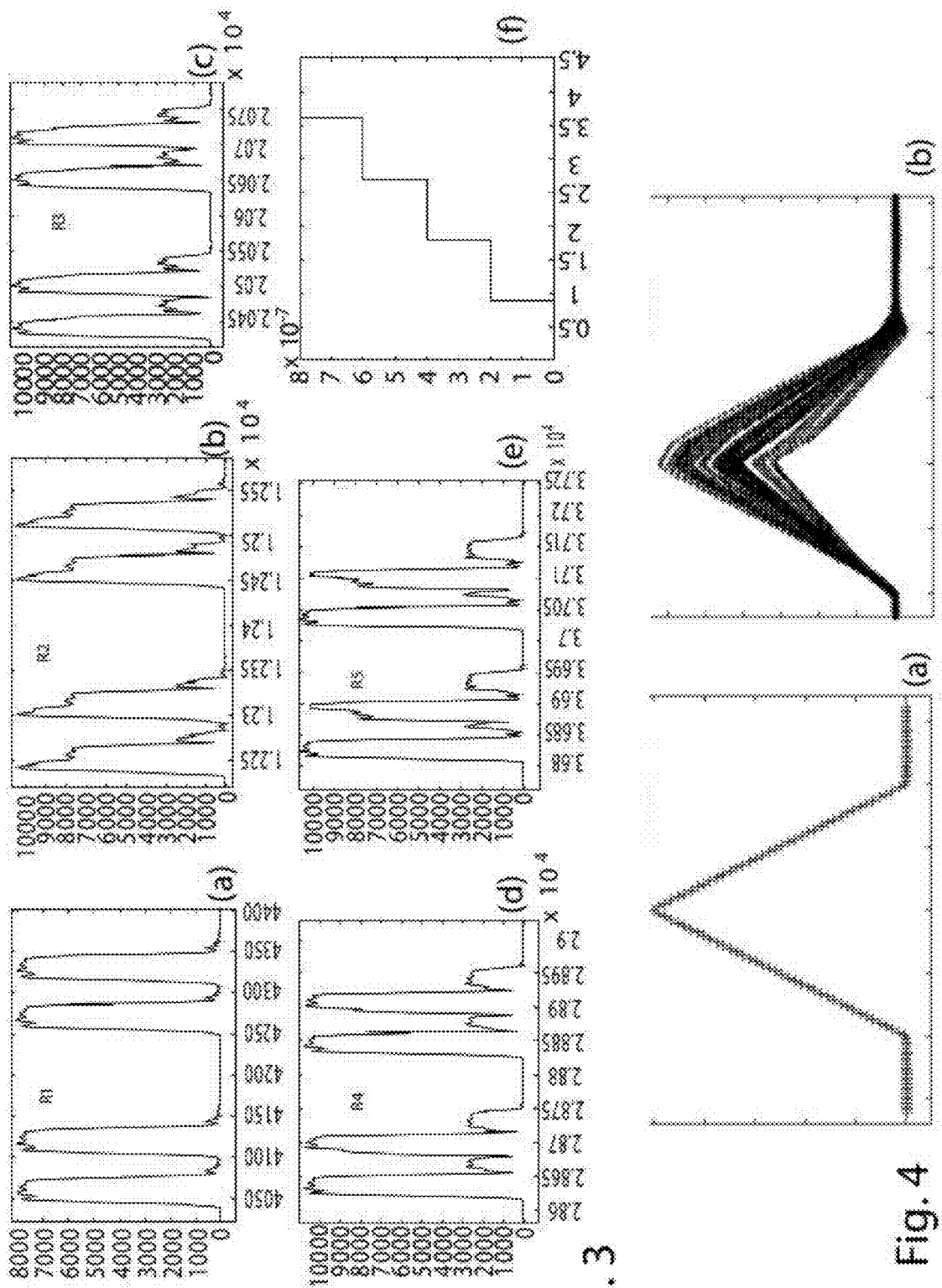
FIGS. 3 (a)-(f) show a similar situation to that of FIGS. 2 (a)-(f), but in the counter-phase case.
FIG. 4 shows a deformation effect of the signal outputting the correlator, due to the multipath phenomenon, showing in (a) the case of ideal autocorrelation, and in (b) the case of real autocorrelation with multipath.

Making reference to graphs (a)-(f) of FIGS. 2 and 3, as known in the art, the multipart has an effect on the preamble of the mode A/C/S replies. In the example, one reproduces only the effect on the mode S, with the level of the reflected signal reduced by around ¾ with respect to the amplitudes of the direct LOS signal (cf. FIG. 1) on the receiver, in phase (FIG. 2) and in counter-phase (FIG. 3).

The estimation of the time of arrival is effected by using a suitable correlator, which correlates the signal received by the target (with the multipath superimposed) with a suitable standard preamble matrix that is preloaded in the same receiver. In such a way, such as one known in the art, one can obtain the time of arrival in correspondence of the maximum of the correlation function.

The multipath phenomenon tends to deform the signal outputting the correlator with a subsequent effect on the estimate of the time of arrival. The foregoing is confirmed in FIG. 4. As one can observe, the correlation function (FIG. 4 (b)) undergoes a deformation which results in the shifting of the correlation peak and therefore in an error in the estimation of the time of arrival.

Figure 5:
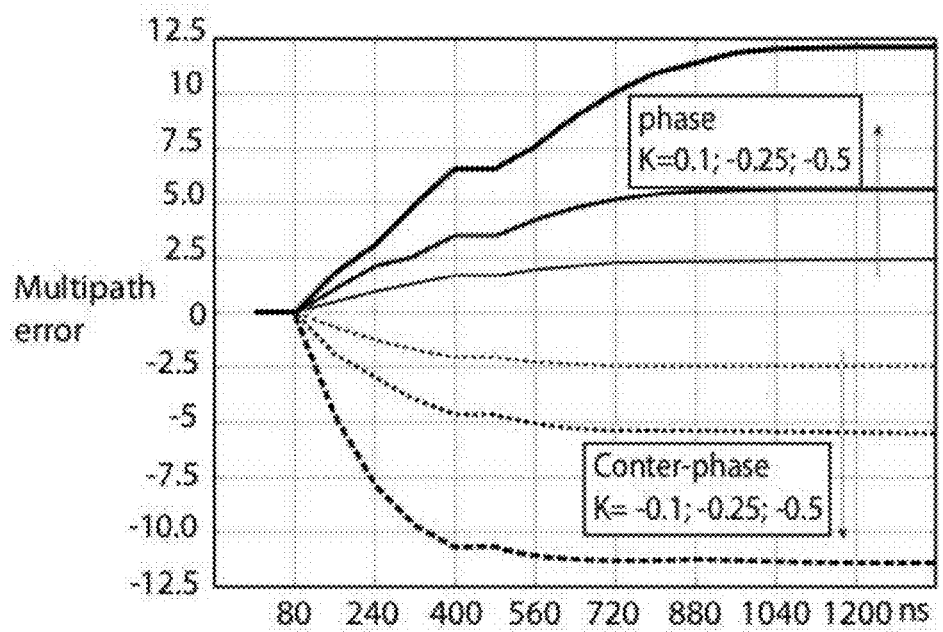
FIG. 5 shows an example of synthesis of the error introduced by the multipath and parameterized for values of the reflected amplitude ranging from 0.1 times to 0.5 times the amplitude of the signal, according to the prior art.

With reference to FIG. 5, one gives the effects of the multipath on the estimation of the time of arrival on the single SSR impulse as a function of:
percentage (K) of the reflected signal amplitude with respect to that of the direct signal;
delay (in nanoseconds) of the reflected signal with respect to the direct one;
phase difference between the reflected and the direct signals (positive K for all the curves above the zero and negative K for all the curves below zero): the curves having larger absolute value ordinates are referred to larger K absolute values.

As a consequence, the introduced error is directly proportional to the amplitude of the reflected wave, the graph of FIG. 5 shows a synthesis of the error introduced by the multipath on the estimation of the time of arrival of the ideal line of sight and is parameterized for values of the reflected amplitude ranging from 0.1 to 0.5 of the signal amplitude. For delay values below 100 ns, the effect of the delay introduced by the multipath is considered negligible.

Figure 10:
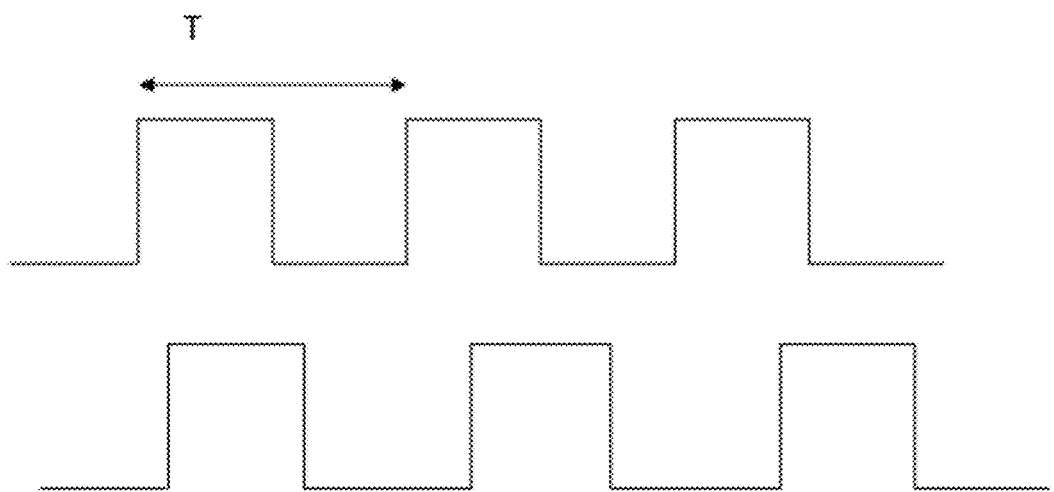
FIG. 10 shows an example of time shift of an ideal signal according to the present disclosure.

The multipath estimation according to the present disclosure is realized by calculating beforehand the distortion of at least a single ideal impulse (for, example, the first impulse in the mode S case) of the signal by the autocorrelation function for a discrete number of delay values. In FIG. 10, a time shift is shown for an ideal signal with impulses having T period.

The multipath estimation according to the present disclosure is realized by calculating beforehand the distortion of at least a single ideal impulse (the first impulse in the mode S case according to an embodiment of the present disclosure) of the signal by the autocorrelation function for a discrete number of delay values. In FIG. 10, the time shift is shown for an ideal signal with impulses having T period.

On the basis of the distortion obtained from the ideal correlation function (given in FIG. 4 (a)) one can infer back to the variation of the parameters of the impulse and estimate the effect of the multipath to be taking into account for compensation in the estimation of the time of arrival.

The fact of considering a single impulse corresponds to the necessity of applying the method of the present disclosure on "clean" impulses (i.e. impulses that have not been destroyed by a "fruiting" interference, where "fruit" refers to "False Replies Unsynchronized In Time").

An embodiment of the present disclosure first estimates the offset generated by the multipath on the time of arrival. The technique uses a mechanism which evaluates, for each SSR signal impulse, the effect of the distortion introduced by the reflected replies.

A basic characteristic of the method consists in the sampling of each impulse of the arriving signal with sampling step p and obtaining 2k+1 samples where, for example, k samples are obtained on the left-hand side of the impulse maximum and k samples are obtained on the right-hand side of the impulse maximum.

One or more subsets of samples are then chosen, on which the elaborations of the method according to the present disclosure are applied. For each subset, an estimator module estimates the effect of the multipath on the considered impulse.

Figure 6:
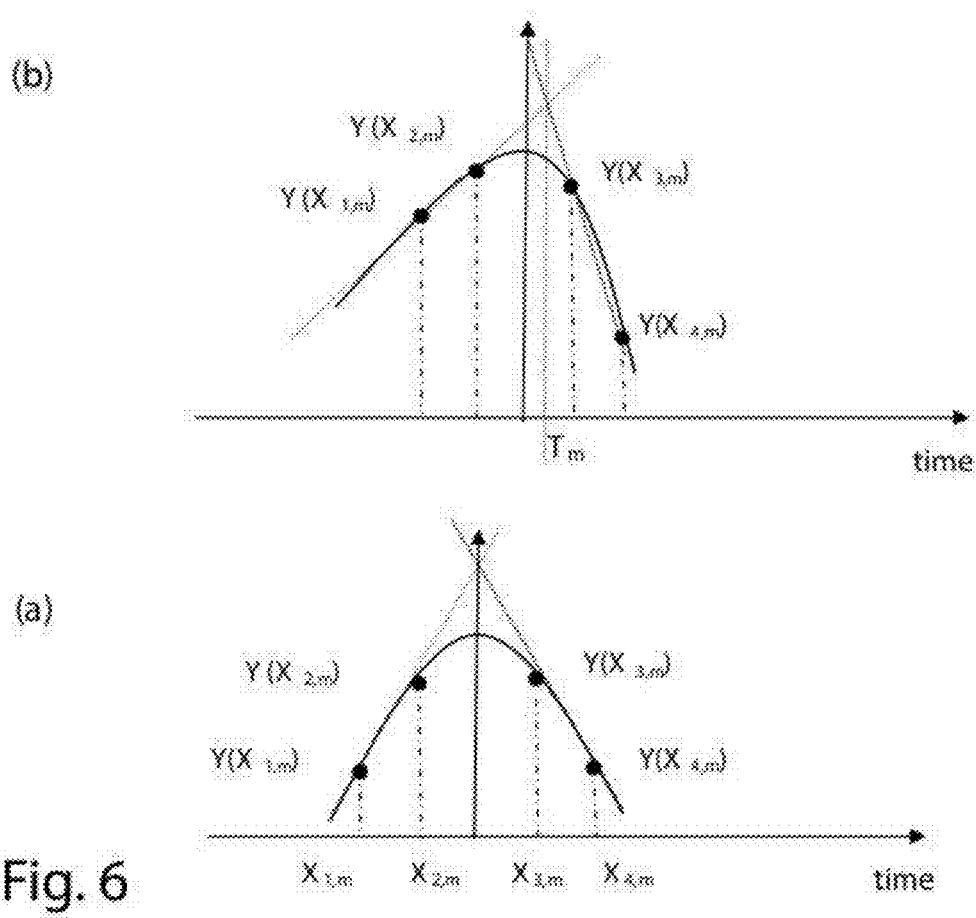
FIG. 6 shows in (a) the correlation function affected by multipath, and in (b) a correlation function which is not affected by multipath.

In an embodiment of the present disclosure, each estimator module evaluates the slope of the correlation function (see, for example, a bell-shaped function given in FIG. 6 (a) in the ideal form without multipath) on its left-hand side and right-hand side. According to an aspect of the present disclosure, the slope is obtained by using different sample pairs, which form said subset. With reference to FIG. 6, an example of two interpolating straight-lines traced on the autocorrelation function is also given.

Let us indicate with the superscript "L", the generic element (sample, coefficient, value) referred to the left-hand side of the correlation function and with the superscript "R", the analogous elements referred to the right-hand side of the autocorrelation function of the impulse (on the left/right side of the ordinates axis passing for the maximum of the correlation function). Let us indicate moreover with the subscript "m", the counter (positive integer) of the various subsets of samples with which one carries out the estimation. The four samples have coordinates $X_{1,m}, Y_{1,m}, X_{2,m}, Y_{2,m}$ for the first pair on the left-hand side of said axis and $X_{3,m}, Y_{3,m}, X_{4,m}, Y_{4,m}$ for the second pair on the right-hand side of said axis, where $X_{1,m}$ is symmetrical to $X_{4,m}$ with respect to the axis. Furthermore, $X_{2,m}$ is symmetrical to $X_{3,m}$ with respect to the axis.

It is here to be noted that when one receives the impulse and calculates the autocorrelation function, one individuates the maximum and places the ordinates axis in correspondence to said maximum. Starting from the values of the samples, it is possible to derive the angular coefficients of the straight lines passing through the set of four points, indicated by $a^L_m$, $a^R_m$ and given by the following expressions:

$$a^L_m = \frac{C(X_{2,m}) - C(X_{1,m})}{X_{2,m} - X_{1,m}}$$

$$a^R_m = \frac{C(X_{4,m}) - C(X_{3,m})}{X_{4,m} - X_{3,m}}$$

where C( ) represents the above autocorrelation function.

In the ideal case, i.e. in the absence of multipath, the two coefficients $a^L_m$ and $a^R_m$ have equal absolute values and the intersection of the two straight lines would correspond to an abscissa equal to 0. In the case of multipath effect, the coefficients come out to be different and an offset $T_m$ will appear on the abscissa, which can be correlated to a variation of the time of arrival of the impulse. Such an offset is calculated as:

$$T_m = C(X_{3,m}) - C(X_{2,m}) + d/2(a^R_m - a^L_m)/(a^L_m - a^R_m) \quad (1)$$

The expression (1) is derived as follows. Let $y^L_m = a^L_m x + b^L_m$ be the equation of the straight line relevant to the left-hand side of the correlation function and let $y^R_m = a^R_m x + b^R_m$ be the equation of the straight line relevant to the right-hand side of the correlation function.

By putting the two previous integrations of the two straight lines into a system, one finds the intersection point of the two straight lines whose abscissa will represent the offset $T_m$ of the maximum of the correlation function, as distorted because of the multipath delay, and the correlation function being approximated linearly by the choice of the four samples. According to an embodiment of the present disclosure, one finds that:

$$T_m = \frac{b^R_m - b^L_m}{a^L_m - a^R_m} \quad (2)$$

Now that $b^L_m = Y_{2,m} + a^L_m \times d/2$ and $b^R_m = Y_{3,m} + a^R_m \times d/2$, where d (equal to $X_{3,m} - X_{2,m}$) is the generic distance between the two samples (the time distance between the maximum point and the sampled is therefore d/2). By substituting these expressions in (2), one obtains the offset estimation:

$$T_m = (Y_{3,m} - Y_{2,m}) + d/2(a^R_m - a^L_m)/(a^L_m - a^R_m) \quad (3)$$

which represents the offset of the correlation function for the samples pairs on the left-hand side of the correlation function and on the right-hand side of the correlation function.

This principle is repeated for different choices of the quadruplets of samples suitably distributed along the correlation function. The use of the distributed samples allows one to estimate the multipath with higher accuracy. The effect one obtains on the correlation function is a set of straight lines distributed along the rise front and the fall front.

Figure 7:
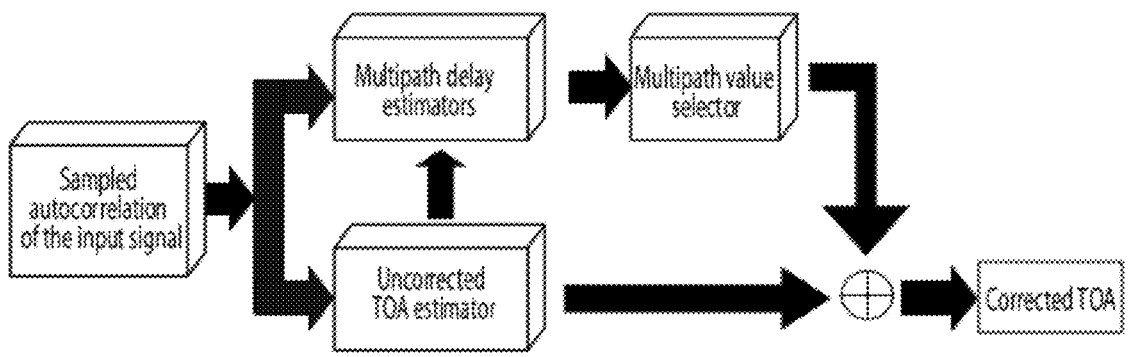
FIG. 7 shows a block and flow chart mixed diagram for illustrating a portion of the method according to the disclosure, starting from the reception of the replies.

In the case that the samples, $Y_{3,m}$ and $Y_{2,m}$, are chosen for any quadruplet as the sampled immediately adjacent to the maximum point (at a distance equal to the sampling step p), one will have d=2p. Advantageously, the choice of the quadruplets continues by keeping fixed the samples $Y_{3,m}$ and $Y_{2,m}$ and selecting the samples $Y_{1,m}$ and $Y_{4,m}$ among the remaining 2k-4 samples representative of the reply signal. FIG. 7 illustrates the general method.

Figure 8:
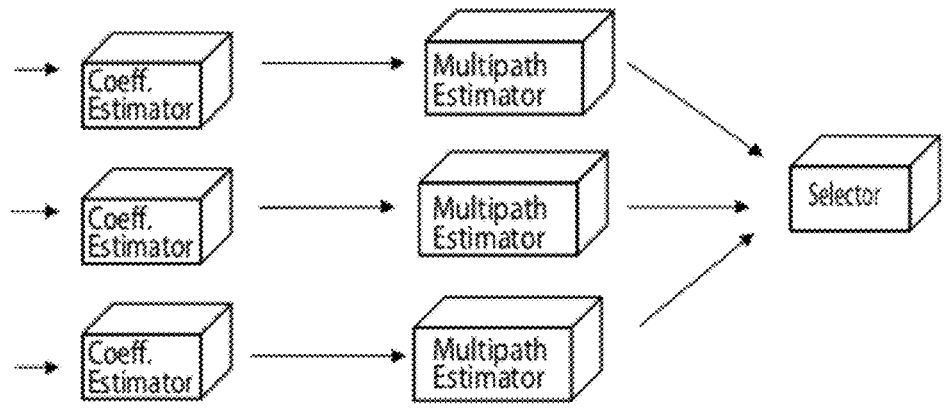
FIG. 8 shows a block and flow chart mixed diagram for illustrating a portion of the method according to an embodiment the present disclosure.

Making reference to FIG. 8, for each of these samples pairs, it is evaluated, according to (1), the contribution of the introduced multipath. In FIG. 8 each block labeled "Coeff. Estimator" calculates the coefficients of the approximation straight lines relevant to a single quadruplet. The corresponding block labeled "Multipath Estimator" determines the value of the estimation according to (1) starting from the output of the block labeled "Coeff. Estimator". Finally, the outputs of all the blocks labeled "Multipath Estimator", which implement the equation (1) for each quadruplet, are sent to the block labeled "Selector". Also illustrated in FIG. 9, the selector evaluates the consistency of the estimation and selects the value of the correction to be applied to the time of arrival.

Figure 9:
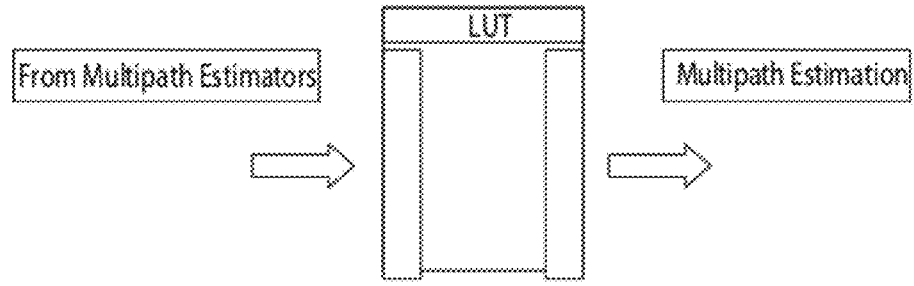
FIG. 9 shows a block and flow chart mixed diagram for illustrating a portion of the method according to an embodiment of the present disclosure.

The block labeled "selector" indicated in FIG. 8 is implementable by a lookup table (LUT) and defines a relation between the outputs of the different multipath Estimators and the actual estimation of the multipath. In FIG. 9, the simplified representation of the model with the Selector block is given.

The lookup table is an exemplary embodiment of a comparison of the estimated multipath delays values with the simulated curves, each simulated curve being univocally associated to predetermined multipath features. The simulation can be realized by pure calculation (software) or by using a simulation apparatus wherein one applies a predetermined distortion of the signal. Instead of the look up table, one can minimize a function with the coefficients of the estimated straight lines and the straight lines relevant to simulated curves equivalent to the impulses affected by multipath to determine the simulated curve which best reproduces the estimation and the relevant offset value.

The dimension of the lookup table is equal to the number of the multipath estimations effected on as many quadruplets. The dimension of the lookup table (number of values for any dimension) is determined by the time sampling step.

Summarizing, multiple Multipath Estimator blocks evaluate the different corrections of the time of arrival $T_m$ for different values of m, estimating the distortion based on a mathematical model capable of evaluating with accuracy the variation of the parameters characteristic of the received impulses with respect to those of an ideal impulse, as above described. The output of these distortion estimators is a value synthesizing the effect of the distortion introduced by the multipath.

Subsequently, one selects the most coherent estimation value and identifies a univocal correspondence between the offset introduced by the multipath on the SSR reply and the above-mentioned coherent value. The selection and correspondence determination operations commutate and therefore the selection and correspondence determination operations can be executed in any order.

The selection of the coherent value is effected by a statistical analysis of the distribution of the estimated or simulated values.

The individuation of the correspondence is expressed by means of a function (for example, by lookup table) which associates to each of the synthetic parameters of the SSR reply a time offset value in the estimation of the time of arrival.

Instead of the sample quadruplets, one can utilize any number of samples (at least three) and find the best correlating polynomial, and then use the lookup table or the functions as shown above.

Figure 11:
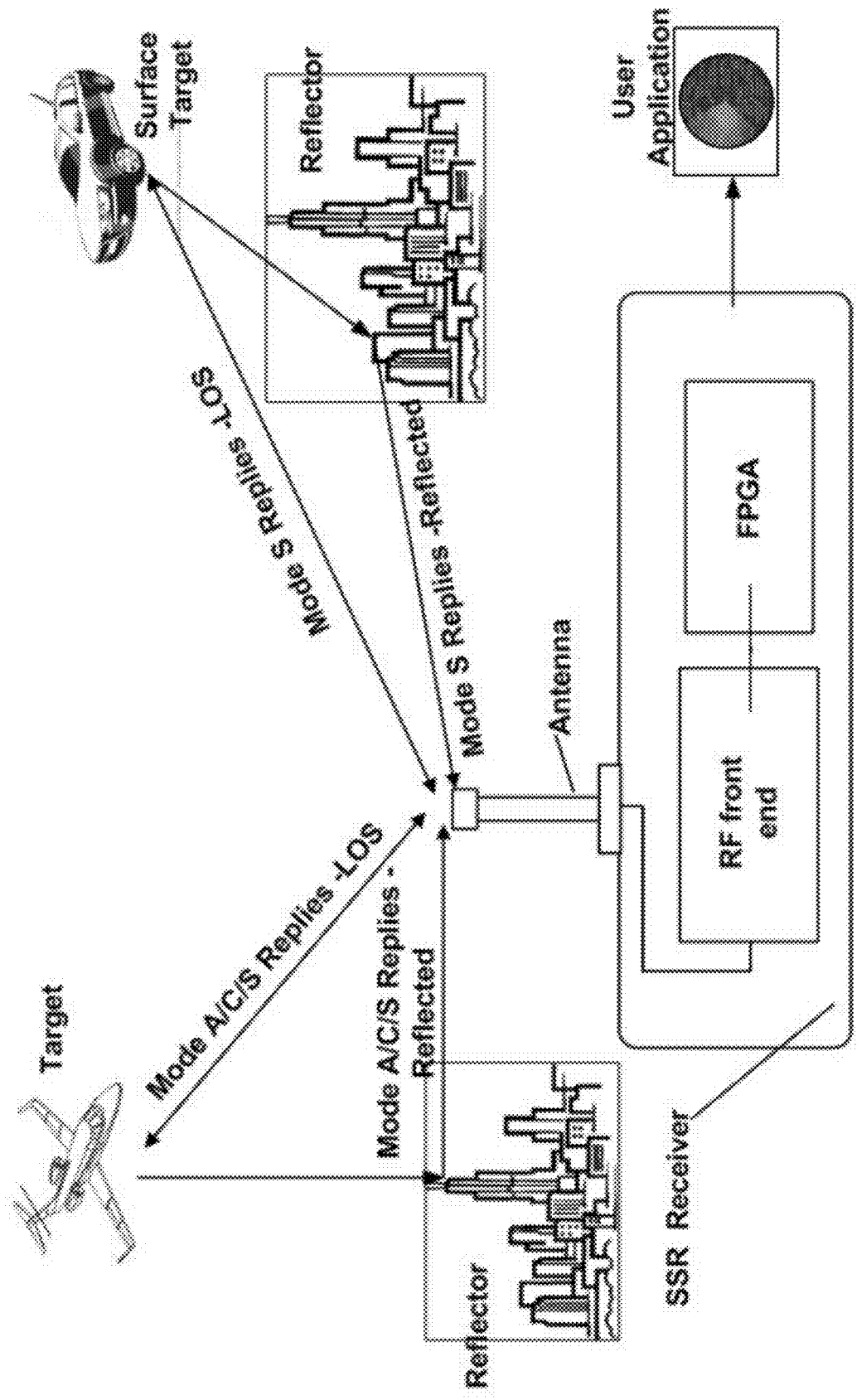
FIG. 11 shows a block diagram of the generation of the multipath effect and the subsequent signal treatment according to an embodiment of the present disclosure.

FIG. 11 shows the generation of a multipath effect with the detection of an aircraft or a car. The treatment section on the bottom comprises a RF front end block and an FPGA executing the method described above.

Figure 12:
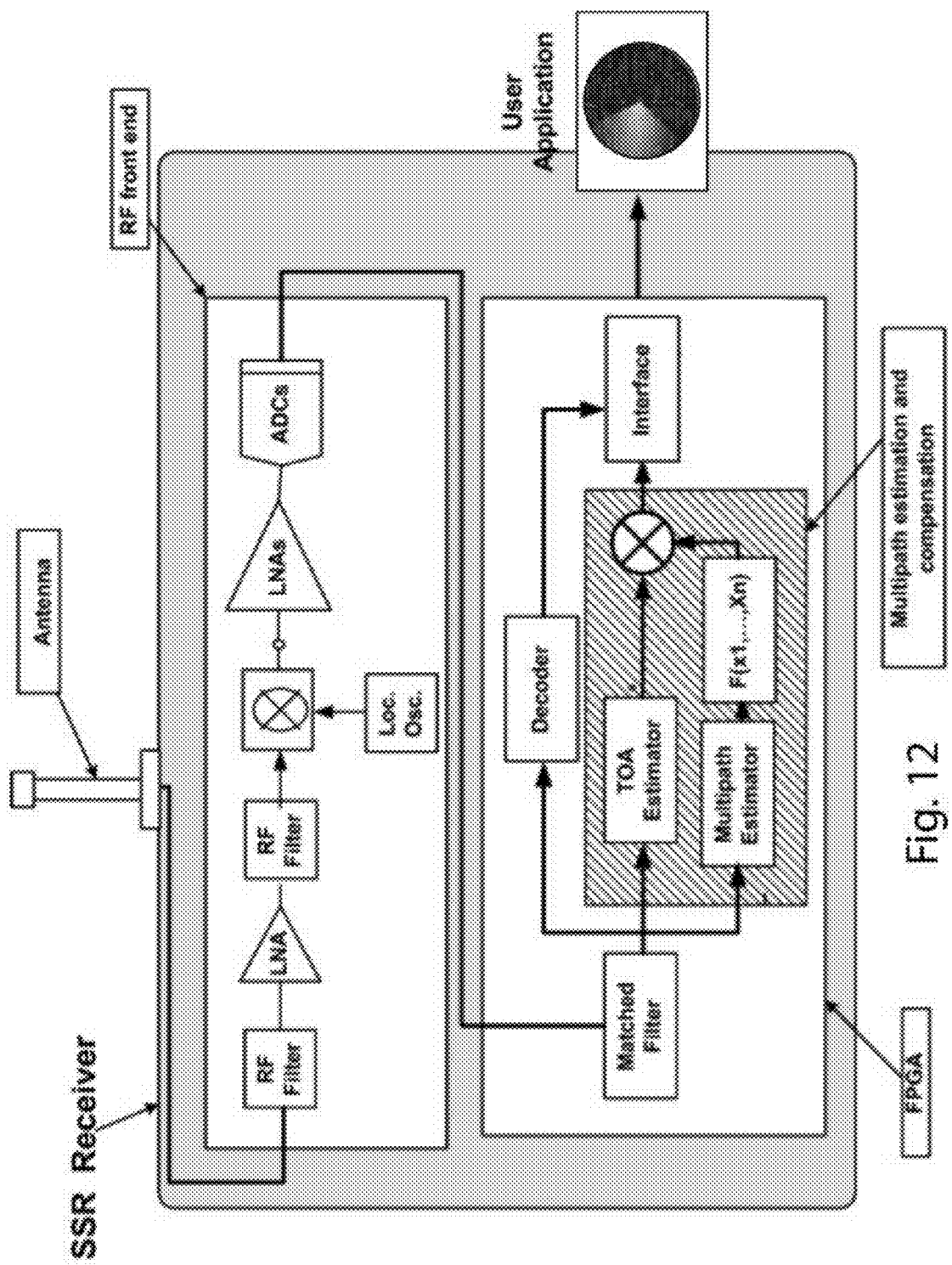
FIG. 12 shows the treatment section of FIG. 11 in more detail, in particular, the signals (replies) received by the various (direct or reflected) sources are filtered, down converted and sampled thereby passing to discrete time.

FIG. 12 shows the treatment section in more detail, according to an embodiment of the present disclosure. The RF front end block includes:
   a first RF Filter;
   a first LNA (Low-Noise Amplifier);
   a second RF Filter;
   a local oscillator;
   a mixer mixing the signals of local oscillator and the filtered signal (this step shift the signal into another band, e.g. IF or base band);
   one or more Second LNA;
   one or more ADC (Analog Digital Converter).

The FPGA includes a Matched Filter Block for calculating the autocorrelation function, a TOA Estimator for estimating the Time of Arrival above mentioned, a Multimath Estimator as above explained, and the block with the function is the look-up table above explained. Moreover, a decoder block extracts other information from the signal. An interface is also present to collect all the extracted and calculated information and show the result on a user application screen. Among the information given by the interface, there are:
   Time of arrivals corrected with the multipath estimation;
   amplitude levels of the signals;
   bits of confidence relevant to the information decoded by the decoder; and
   possible extracted plots.

The innovative features of embodiments described in the present disclosure include:
1. cancellation of the multipath in the real-time (application of the correction factor): collaboration process is executed in real time during the decoding of each single SSR reply; and
2. weighted estimation of the offset, based on the contribution of the single offset, associated to the various replies, and the confidence of the respective impulses.

Figure 13:
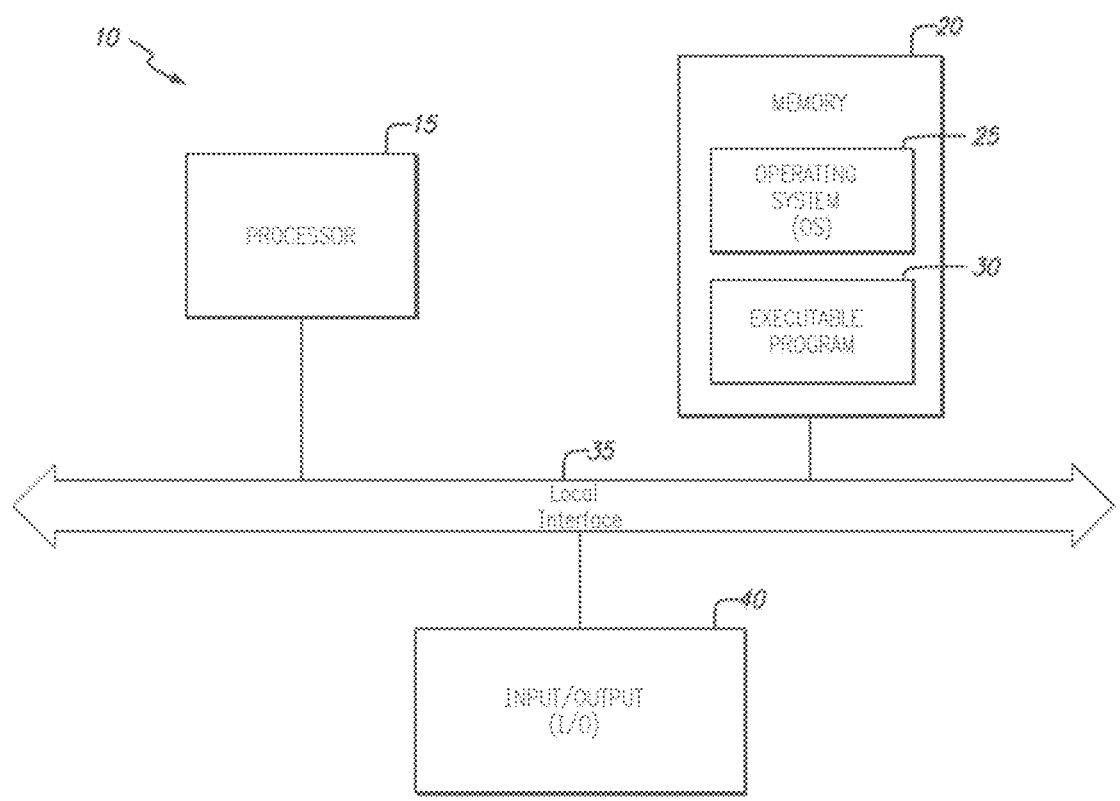
FIG. 13 shows a system that may be used to implement the various steps of the method for estimation and cancellation of multipath delay of electromagnetic signals method of the present disclosure.

FIG. 13 is an exemplary embodiment of a system (10) (e.g. a computer system, workstation) for implementing the steps for the method of estimation and cancellation of multipath delay of electromagnetic signal described above (and which can be seen in steps 1-8 of FIG. 14). The system (10), as seen in FIG. 13, comprise a processor (15), memory (20), a local interface (35) and one or more input and/or output (I/O) devices (40). The processor (15) may execute one or more instructions related to the implementation of the methods described above and as provided by the operating system (OS) (25) based on some executable program stored in the memory (20). These instructions are carried to the processors (20) via the local interface (35) and as dictated by some data interface protocol specific to the local interface and the processor (15). It should be noted that the local interface (35) is a symbolic representation of several elements such as controllers, buffers (caches), drivers, repeaters and receivers that are generally directed at providing address, control, and/or data connections between multiple elements of a processor based system. In some embodiments the processor (15) may be fitted with some local memory (cache) where it can store some of the instructions to be performed for some added execution speed. Execution of the instructions by the processor may require usage of some input/output device (40), such as inputting data from a file stored on a hard disk, inputting commands from a keyboard, outputting data to a display, or outputting data to a USB flash drive. In some embodiments, the operating system (25) facilitates these tasks by being the central element to gathering the various data and instructions required for the execution of the program and provide these to the microprocessor. In some embodiments the operating system may not exist, and all the tasks are under direct control of the processor (15), although the basic architecture of the target hardware device (10) will remain the same as depicted in FIG. 13. In some embodiments, a plurality of processors may be used in a parallel configuration for added execution speed. In such a case, the executable program may be specifically tailored to a parallel execution. Also, in some embodiments the processor (15) may execute part of the methods described above and some other parts may be implemented using dedicated hardware/firmware placed at an I/O location accessible by the system (10) via a local interface (35). The system (10) may include a plurality of executable programs (30), wherein each may run independently or in combination with one another.

Alternatively or in addition, other embodiments can also be possible according to the present disclosure. For example, as seen in FIG. 14 (steps 1-8) a method for the estimation of the time of arrival of electromagnetic signals affected by multipath (e.g. SSR replies) is described. The method comprising the execution of the following steps:
   A1. Sampling an electromagnetic signal received by an antenna, with a sampling step p>0, the sampling step producing 2k+1 samples with k positive integer; and
   A2. Calculation of an autocorrelation function of the sampled electromagnetic signal obtained in step A1;
wherein the following further steps are performed:
   B. For an impulse of said electromagnetic signal, and for each value of m=1, ... M, wherein m e M are positive integers, performing the following substeps:
      B1. Choosing a set of N points on the right-hand side of a maximum of said autocorrelation function, and N points on the left-hand side of said maximum, with N positive integer smaller than k;
      B2. Calculating a first polynomial interpolating the points of said set of N points on the right-hand side and a second polynomial interpolating the points of said set of N points on the left-hand side; and
      B3. Calculating an intersection point of said first and said second interpolating polynomial, and an abscissa distance $T_m$ between said intersection point and the maximum of said autocorrelation function, $T_m$ representing an estimation value of the multipath effect;

C. Starting from an ideal electromagnetic signal with equal impulses having periodicity C1. Delaying each impulse of said ideal electromagnetic signal by a predefined different time till one finds a same periodicity $T^I$, obtaining a delayed signal;

C2. Multiplying L times, with L a positive integer, the delayed signal of the C1 step by a coefficient h each time different, h being a real number comprised between −1 and 1, and summing up the result of the multiplication to said ideal electromagnetic signal, obtaining L composed electromagnetic signals simulating different effects of multipath and for which one knows by construction the ideal time of arrival in the absence of multipath;

C3. Estimating a time of arrival of each of said L composed electromagnetic signals, obtaining an estimation of the time of arrival having by construction an estimation error due to the effect of the multipath, that is calculated as a difference between the ideal time of arrival and the estimated time of arrival;

C4. Executing the steps A1, A2, B1, B2, B3 on said composed electromagnetic signal, obtaining L×M simulated values for the abscissa distance $T^S_{1,1} \ldots T^S_{M,L}$ between said intersection point and the maximum of said autocorrelation function for the L composed electromagnetic impulses; and C5. Associating to each of said L×M distance simulated values $T^S_{1,1} \ldots T^S_{M,L}$ the corresponding estimation error $e^S_{1,1} \ldots e^S_{M,L}$;

D. Individuating among the values $T^S_{1,1} \ldots T^S_{M,L}$ the simulated values $T^S_1 \ldots T^S_M$ closer to values $T_1 \ldots T_M$ of step B;

E. Associating to said values $T_1 \ldots T_M$ the estimation errors relevant to the values $T^S_1 \ldots T^S_M$;

F. Utilizing a statistical analysis of the distribution of the estimation errors obtained in step E, to reduce the standard deviation of said distribution and select a subset $e_1 \ldots e_v$ of the estimation values most close to each other; and G. Performing an average of said $e_1 \ldots e_v$, obtaining an average value, the average value being assumed as the estimation error of said electromagnetic signal received by an antenna.

There may be additional embodiments possible according to the present disclosure dependent on the above method. For example, a method where the substeps B1-B3 of the B step are executed by:

B1. Choosing two points pairs symmetrically on one side and the other of the ordinates axis passing for the maximum point of the autocorrelation function, having coordinates $X_{1,m}, Y_{1,m}, X_{2,m}, Y_{2,m}$ for the first pair on the left-hand side of said axis and $X_{3,m}, Y_{3,m}, X_{4,m}, Y_{4,m}$ for the second pair on the right-hand side of said axis;

B2. Calculating the two angular coefficients $a^L_m$, $a^R_m$ of the two straight lines passing respectively for the points of said first and said second points pair;

B3. Calculating an estimation value $T_m$ of the multipath effect according to the relationship:

$$T_m = (Y_{1,m} - Y_{4,m}) + d/2((a^L_m + a^R_m)/(a^L_m - a^R_m))$$

Wherein d is the distance of the two points of the two pairs immediately close to the axis passing for the maximum of said autocorrelation function.

Furthermore such embodiments can have step C5 be performed as construction of a lookup table and the steps E and D are performed by using said lookup table. The number of values of said lookup table depends on the time sampling step p of the sampling of the step A1.

In addition, an embodiment can pertain to an electromagnetic signal that is constituted by a SSR reply. In such a embodiment, the steps from A to G are applied to each single impulse of said SSR reply, thus obtaining a corresponding plurality of multipath delay values. The plurality of multipath delay values undergoing a further statistical analysis to determine the best estimation value of the multipath delay for the whole SSR reply.

As described above, the methods can be implemented in a computer based system, where, as an embodiment, the computer based system comprises code set up to carry out the steps of the method described above. Such code can be stored in a tangible memory support readable by the computer. Furthermore, an electronic elaborator can be the type of computer where the method is installed on.

The examples set forth above are provided to give those of ordinary skill in the art a complete disclosure and description of methods and systems pertaining to estimation and cancellation of multipath delay of electromagnetic signals and are not intended to limit the scope of what the inventors regard as their disclosure. The skilled person may find other suitable implementations of the presented embodiments.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims. For example, the method according to an embodiment of the present disclosure is applicable to various fields of telecommunications, e.g. to the SSR radars.

The invention claimed is:

1. A computer system for estimating time of arrival of electromagnetic signals affected by multipath, the computer configured to perform the steps of:

a) sampling, by the computer, an electromagnetic signal received by an antenna, wherein the sampling is performed, by the computer, using a sampling step (p>0) and produces 2k+1 samples where k is a positive integer;

b) calculating, by the computer, an autocorrelation function of a sampled electromagnetic signal;

c) calculating, by the computer, a first set of abscissa distance values ($T_m$) for an impulse of the electromagnetic signal of M values, between an intersection point and a maximum point of the autocorrelation function;

d) calculating, by the computer, second set of abscissa distance values ($T^S_{1,1} \ldots T^S_{M,L}$) from an ideal electromagnetic signal;

e) individuating, by the computer, among all the second set of abscissa distance values, particular second set of abscissa distance values that are closer to values of the first set of abscissa distance values obtained in step c) thereby indicating relevance;

f) associating, by the computer, the first set of abscissa distance values with estimation errors relevant to the second set of abscissa distance values;

g) utilizing, by the computer, a statistical analysis of a distribution of the estimation errors obtained in step f) to reduce standard deviation of the distribution and select a subset of estimation values most close to each other; and h) performing, by the computer, an average of the subset of estimation values thereby obtaining an average value, the average value being assumed as the estimation error of said electromagnetic signal received by the antenna.

2. The computer system according to claim 1, wherein calculating, by the computer, the first set of abscissa distance values $T_m$ for each value of M for the impulse of the electromagnetic signal comprises:

c-1) choosing, by the computer, the set of points (for example, N points) on the right-hand side and the left-hand side of the maximum of the autocorrelation function, where the set of points (N) is a positive integer smaller than k;

c-2) calculating, by the computer, a first polynomial interpolating points of the set of points on the right-hand side and a second polynomial interpolating the points of the set of points on the left-hand side; and c-3) calculating, by the computer, the set of abscissa distance values $T_m$ from the intersection point of the first polynomial and second polynomial and the maximum point of the autocorrelation function.

3. The computer system according to claim 1, wherein calculating the second set of abscissa distance comprises:

d-1) delaying, by the computer, each impulse of an ideal electromagnetic signal by a predefined different time until a same periodicity is found thereby obtaining a delayed signal;

d-2) multiplying, by the computer, a desired number of times (for example, L times), the delayed signal by a coefficient h, a real number comprised between −1 and 1, for each different time and summing the result of the multiplication to the ideal electromagnetic signal thereby obtaining the desired number (L) of composed electromagnetic signals each simulating different effects of multipath and for which one knows by construction an ideal time of arrival in an absence of multipath;

d-3) estimating, by the computer, a time of arrival of each desired number of composed electromagnetic signals thereby obtaining an estimation of the time of arrival having by construction an estimation error due to the effect of the multipath, that is calculated as a difference between the ideal time of arrival and the estimated time of arrival;

d-4) executing steps a), b), and c), by the computer, on the desired number of composed electromagnetic signals thereby obtaining a number of simulated values (for example, L×M) for the second set of abscissa distances between an intersection point and a maximum of the autocorrelation function for the desired number of composed electromagnetic impulses; and d-5) associating, by the computer, to each of the number of simulated values for the second set of abscissa distances, corresponding estimation error.

4. The computer system according to claim 1, wherein calculating the first set of abscissa distance values further comprises:

choosing, by the computer, the set of points further comprises choosing two pairs of points symmetrically on the left-hand side and on the right-hand side of an axis passing through the maximum point of the autocorrelation function, wherein coordinates $X_{1,m}, Y_{1,m}$, $X_{2,m}, Y_{2,m}$ denote the first pair on the left-hand side of the axis, and coordinates $X_{3,m}, Y_{3,m}, X_{4,m}, Y_{4,m}$ denote the second pair on the right-hand side of the axis;

calculating, by the computer, two angular coefficients, denoted as $a^L_m, a^R_m$, of two straight lines passing respectively for the points of the two pairs of points; and calculating, by the computer, an estimation value of the multipath effect according to the following relationship:

$$T_m = (Y_{1,m} - Y_{4,m}) + d/2((a^L_m + a^R_m)/(a^L_m - a^R_m)),$$

wherein d is a distance of two points of the two pairs of points immediately close to the axis passing through the maximum of the autocorrelation function.

5. The computer system according to claim 3, wherein the associating, to each of the number of simulated values for the second set of abscissa distance values, corresponding estimation error, is performed as construction of a lookup table, where values of the lookup table correspond to a sampling step (p) of step a) and where the lookup table can be used for steps f) and g).

6. The computer system according to claim 1, wherein the electromagnetic signal comprises a SSR reply and the steps a) to h) are applied to each single impulse of the SSR reply thereby obtaining a corresponding plurality of multipath delay values, the plurality of delay values used in a further statistical analysis to determine a best estimation value of a multipath delay for the SSR reply.

7. The computer system according to claim 1, wherein the steps of the method are implemented through software code.

8. The computer system according to claim 7, wherein the software code is stored on tangible memory support readable by the computer.

9. The computer system according to claim 1, wherein the computer is an electronic elaborator.

10. A secondary surveillance radar (SSR) receiver, comprising:

a radio frequency (RF) front end, and the computer system according to claim 1.

11. A computer-based method for estimating time of arrival of electromagnetic signals affected by multipath comprising:

a) sampling, by a computer, an electromagnetic signal received by an antenna, wherein the sampling is performed using a sampling step (p>0) and produces 2k+1 samples where k is a positive integer;

b) calculating, by the computer, an autocorrelation function of a sampled electromagnetic signal;

c) calculating, by the computer, a first set of abscissa distance values ($T_m$) for an impulse of the electromagnetic signal of M values, between an intersection point and a maximum point of the autocorrelation function;

d) calculating, by the computer, second set of abscissa distance values ($T^S_{1,1} \ldots T^S_{M,L}$) from an ideal electromagnetic signal;

e) individuating, by the computer, among all the second set of abscissa distance values, particular second set of abscissa distance values that are closer to values of the first set of abscissa distance values obtained in step c) thereby indicating relevance;

f) associating, by the computer, the first set of abscissa distance values with estimation errors relevant to the second set of abscissa distance values;

g) utilizing, by the computer, a statistical analysis of a distribution of the estimation errors obtained in step f) to reduce standard deviation of the distribution and select a subset of estimation values most close to each other; and h) performing, by the computer, an average of the subset of estimation values thereby obtaining an average value, the average value being assumed as the estimation error of said electromagnetic signal received by the antenna.

12. The computer-based method according to claim 11, wherein calculating, by the computer, the first set of abscissa distance values $T_m$ for each value of M for the impulse of the electromagnetic signal comprises:

c-1) choosing, by the computer, the set of points (for example, N points) on the right-hand side and the left-hand side of the maximum of the autocorrelation function, where the set of points (N) is a positive integer smaller than k;

c-2) calculating, by the computer, a first polynomial interpolating points of the set of points on the right-hand side and a second polynomial interpolating the points of the set of points on the left-hand side; and c-3) calculating, by the computer, the set of abscissa distance values $T_m$ from the intersection point of the first polynomial and second polynomial and the maximum point of the autocorrelation function.

13. The computer-based method according to claim 11, wherein calculating the second set of abscissa distance comprises:

d-1) delaying, by the computer, each impulse of an ideal electromagnetic signal by a predefined different time until a same periodicity is found thereby obtaining a delayed signal;

d-2) multiplying, by the computer, a desired number of times (for example, L times), the delayed signal by a coefficient h, a real number comprised between −1 and 1, for each different time and summing the result of the multiplication to the ideal electromagnetic signal thereby obtaining the desired number (L) of composed electromagnetic signals each simulating different effects of multipath and for which one knows by construction an ideal time of arrival in an absence of multipath;

d-3) estimating, by the computer, a time of arrival of each desired number of composed electromagnetic signals thereby obtaining an estimation of the time of arrival having by construction an estimation error due to the effect of the multipath, that is calculated as a difference between the ideal time of arrival and the estimated time of arrival;

d-4) executing steps a), b), and c), by the computer, on the desired number of composed electromagnetic signals thereby obtaining a number of simulated values (for example, L×M) for the second set of abscissa distances between an intersection point and a maximum of the autocorrelation function for the desired number of composed electromagnetic impulses; and d-5) associating, by the computer, to each of the number of simulated values for the second set of abscissa distances, corresponding estimation error.

14. The computer-based method according to claim 11, wherein calculating the first set of abscissa distance values further comprises:

choosing, by the computer, the set of points further comprises choosing two pairs of points symmetrically on the left-hand side and on the right-hand side of an axis passing through the maximum point of the autocorrelation function, wherein coordinates $X_{1,m}, Y_{1,m}$, $X_{2,m}, Y_{2,m}$ denote the first pair on the left-hand side of the axis, and coordinates $X_{3,m}, Y_{3,m}, X_{4,m}, Y_{4,m}$ denote the second pair on the right-hand side of the axis;

calculating, by the computer, two angular coefficients, denoted as $a^L_m$, $a^R_m$, of two straight lines passing respectively for the points of the two pairs of points; and calculating, by the computer, an estimation value of the multipath effect according to the following relationship:

$$T_m = (Y_{1,m} - Y_{4,m}) + d/2((a^L_m + a^R_m)/(a^L_m - a^R_m)),$$

wherein d is a distance of two points of the two pairs of points immediately close to the axis passing through the maximum of the autocorrelation function.

15. The computer-based method according to claim 11, wherein the associating, to each of the number of simulated values for the second set of abscissa distance values, corresponding estimation error, is performed as construction of a lookup table, where values of the lookup table correspond to a sampling step (p) of step a) and where the lookup table can be used for steps f) and g).

16. The computer-based method according to claim 11, wherein the electromagnetic signal comprises a SSR reply and the steps a) to h) are applied to each single impulse of the SSR reply thereby obtaining a corresponding plurality of multipath delay values, the plurality of delay values used in a further statistical analysis to determine a best estimation value of a multipath delay for the SSR reply.

17. The computer-based method according to claim 11, wherein the steps of the method are implemented through software code.

18. The computer-based method according to claim 17, wherein the software code is stored on tangible memory support readable by the computer.

19. The computer-based method according to claim 12, wherein the computer is an electronic elaborator.

20. A secondary surveillance radar (SSR) receiver, comprising:

a radio frequency (RF) front end, and a computer configured to execute the computer-based method according to claim 11.

* * * * *